United States Patent [19]

Aurichio

[11] Patent Number: 4,664,739

[45] Date of Patent: May 12, 1987

[54] REMOVAL OF SEMICONDUCTOR WAFERS FROM DICING FILM

[75] Inventor: Joseph A. Aurichio, Anderson, S.C.

[73] Assignee: Stauffer Chemical Company, Westport, Conn.

[21] Appl. No.: 562,899

[22] Filed: Dec. 19, 1983

[51] Int. Cl.$^4$ ............................................. B32B 31/26
[52] U.S. Cl. .................................... 156/344; 29/583; 156/235; 156/248; 156/249; 156/264; 156/307.3; 264/345
[58] Field of Search ............... 156/235, 277, 248, 302, 156/249, 315, 268, 344, 307.3, 264; 428/40, 206, 202, 349; 29/583; 252/511, 512; 427/208.2; 264/345; 83/28

[56] References Cited

U.S. PATENT DOCUMENTS 3,600,246  8/1971  Breen .................................. 156/265
3,784,433  1/1974  Garnish et al. ....................... 156/60

Primary Examiner—John J. Gallagher

[57] ABSTRACT

Semiconductor chips, which have been diced, can be removed from the conductive adhesive/polymer support film holding them, without leaving residual adhesive on the film if the wafer/adhesive support film laminate is heated prior to the dicing step. The heating step increases the release characteristics between the adhesive and film.

13 Claims, 6 Drawing Figures

REMOVAL OF SEMICONDUCTOR WAFERS FROM DICING FILM

BACKGROUND OF THE INVENTION

The present invention relates to a process which is useful in the fabrication of semiconductor chips.

In applicant's copending U.S. patent application Ser. No. 519,936, filed Aug. 3, 1983, entitled "Carrier Film with Conductive Adhesive for Dicing of Semiconductor Wafers", a carrier film with conductive adhesive for the dicing (or sawing) of semiconductor wafers containing multiple printed circuitry into individual circuits (chips) is shown. The product contained a release coating on the polymer support film in order to allow for clean release of the conductive adhesive layer with the chip when the latter was removed from the support film after dicing of the wafer.

SUMMARY OF THE PRESENT INVENTION

The present invention relates to removal of a chip/adhesive combination from the polymer support film without residual adhesive remaining on the support film. Substantially all of the conductive adhesive remains with the chip for use in later bonding steps if a heating step precedes the dicing operation. The heating step improves the adhesive/wafer attachment, thereby providing the desired release characteristics between the film and the adhesive.

DESCRIPTION OF THE DRAWINGS

The present invention is further understood by the Drawings, which form a portion of the present specification, wherein.

DETAILED DESCRIPTION OF THE PRESENT INVENTION

Figure 1:
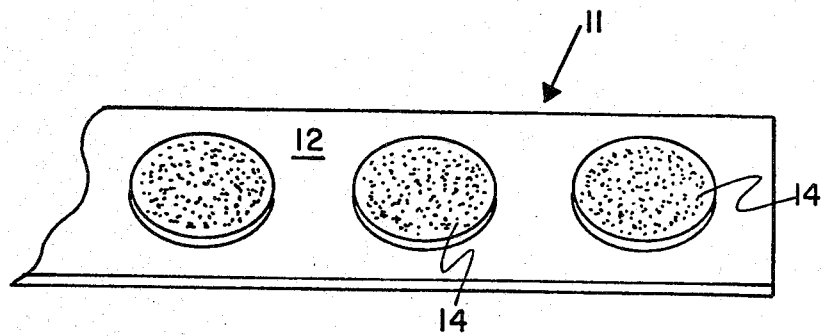
FIG. 1 is a perspective view showing the dicing film and its adherent conductive adhesive patterns for contact with the printed wafer.
Figure 2:
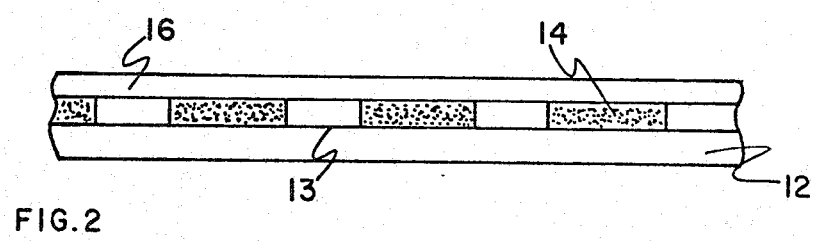
FIG. 2 is an enlarged cross-sectional view of a section of an embodiment of the dicing film suitable for use with the process of the present invention.
Figure 3:
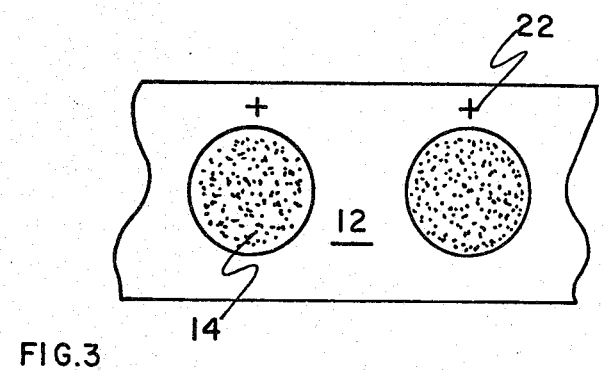
FIG. 3 is an overhead view of a dicing film embodiment suitable for use with the process of the present invention.

The dicing film 11 of the present invention comprises a polymer support film 12 with one surface 13 which is substantially free of a release coating, and, attached to the surface 13, a suitable pattern of conductive adhesive 14 to receive semiconductor wafers 15 for later dicing (not shown). The carrier film 12 needs to have sufficient support for the selected adhesive pattern while allowing such operations as oven drying. It needs to provide support, for example, for the cut chip after the dicing operation. The surface 13 must allow for pick-up of the conductive adhesive/chip combination after the dicing operation without causing injury to the adhesive. The conductive adhesive 14 must have a sufficient level of conductivity, should have good smoothness to allow for full surface contact between it and the wafer and needs to be either dried or partially cured to a suitably tacky state and held in such a state for use at the wafer attachment stage. It needs to have a sufficient degree of cohesiveness to allow for its stripping from the support film without destruction of its physical integrity and also to allow stripping of an optional cover film therefrom. The conductive adhesive should have a suitable degree of thickness, e.g., from about 6 to about 40 microns to impart proper adhesion and electrical requirements for grounding the chip to the ground plane. The present invention enables one to place the chip/adhesive combination in a chip carrier such that the adhesive supports the chip but does not cover any substantial area outside its support area. This allows for a more compact configuration for the necessary wires bonding the chip to the carrier, without increasing the possibility of short circuits arising due to close proximity of wire and conductive adhesive.

The polymer forming support film 12 must also, upon heating as will be described later, have an enhanced release characteristic between it and the conductive adhesive so as to allow for clean separation of adhesive and polymer film without any appreciable residual adhesive remaining on the film. Polyolefin films, such as polypropylene, are one preferred choice. The thickness of the support film can range from about 25 to about 150 microns, with a thickness of 75-150 microns being preferred. Films having the preferred, greater thicknesses of 75-150 microns allow for a somewhat greater degree of safety in view of possible variation in the actual manufacturing tolerances in the dicing operation. An excessively thin film, if cut entirely through due to inherent variations in the manufacturing process, would not provide the needed support for the wafer.

Attached to the exposed surface 13 of the support film is a suitable pattern of conductive adhesive 14 to form a point of attachment for the semiconductor wafers 15 that are to be diced. Generally, the conductive adhesive pattern can comprise a series of circular adhesive marks of a suitable size (e.g., about 2.54-15.2 cm.) to approximate the diameter of the wafer to be mounted thereon. The thickness of the adhesive can range from about 5 microns to about 40 microns. Suitable conductive adhesive compositions which can be utilized include those adhesive materials which are loaded with fillers to meet conductivity requirements (e.g., 2% to about 75%, by weight of a suitable conductive material). Representative conductive materials include finely divided conductive metals (e.g., aluminum, copper, silver, gold, palladium), or carbon black. Representative adhesive materials which can form a matrix for the conductive materials include polyimide, acrylic, epoxy, silicones, and various modified polymeric materials to meet desired thermal and conductivity requirements.

In a preferred embodiment, the dicing film product 11 of the present invention also includes a suitable release liner 16 over the exposed surface of the adhesive to protect it from contamination and/or damage (e.g., inadvertent destruction of the preferred, substantially flat upper surface). For example, release coated paper can be employed as the release liner material. The release liner can have a lesser release characteristic than the surface 13.

Figure 4:
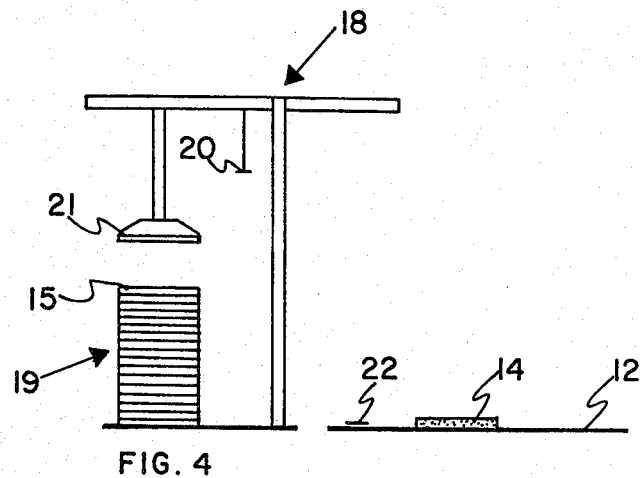
FIG. 4 shows an embodiment in which a wafer is about to be picked up for transfer to the dicing film.
Figure 5:
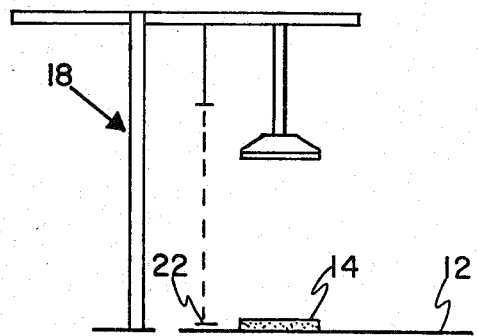
FIG. 5 illustrates alignment of the wafer and adhesive pattern preparatory to attachment of wafer and adhesive.
Figure 6:
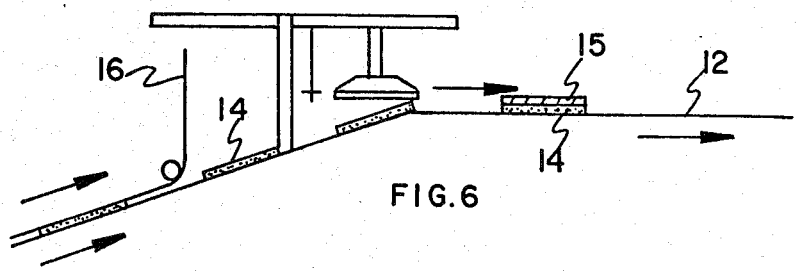
FIG. 6 shows the wafer/adhesive attachment procedure.

FIGS. 4-6 illustrate in a schematic manner in which the dicing film of the present invention can be used. FIG. 4 shows a pivotal vacuum plate assembly about to pick up a semiconductor wafer from an array 19 of stacked wafers 15. FIG. 5 illustrates the configuration of an electric eye 20 guided vacuum plate 21 in aligning wafer and adhesive in response to the registration mark 22 on the film 12. FIG. 6 illustrates the wafer attachment step and also illustrates the prior stripping of the release liner 16 from the conductive adhesive 14/dicing film 12 combination. In actual commercial practice, it is preferred to use a suitable commercially available wafer mounter (e.g., Model 366 from Kulicke and Soffa Industries, Inc.).

The dicing film of the present invention can be formed using conventional lamination and printing operations. The pattern of conductive adhesive can be applied to a dried release layer surface by appropriate printing procedures (e.g., rotary or flat bed screen printing) and then the adhesive is transferred to the support film 12 by lamination. If a release liner is desired over the exposed surface of the adhesive, it can also be applied by conventional lamination procedures.

The heating step of the present process, which improves the release characteristics at the support film surface 13/conductive adhesive 14 interface, is carried out on the wafer/adhesive/film composite prior to the dicing step. This heating step can take place for about 0.25 min. to about 3 min. at temperatures of from about 45° C. to about 70° C. After dicing, cool air can be used on the carrier film side to optimize die release. By use of the heating step and optional cool air steps, non-release coated, polymeric materials can be more effectively used as support films in dicing films of the general type originally disclosed in my pending U.S. application Ser. No. 519,936.

The heating step which is described for use herein aids in wetting out of the adhesive and improves, the adhesion between the wafer and the adhesive so that the adhesive will bond substantially more aggressively to the wafer than to the support film. This will insure clean removal of the adhesive with the wafer, as desired.

The present invention is further illustrated by the Examples which follow.

COMPARATIVE EXAMPLE 1

This Example illustrates the inferior results obtained when the process of the present invention is not followed.

The general procedure used to form each of the samples that were tested involved screen printing of a suitable adhesive pattern (i.e., a succession of circles having a diameter of about 7.6 cm. and a thickness of about 25.4 microns) onto release coated paper. The release coated paper was 42 pound weight semi-bleached kraft paper. The adhesive was a silver modified polyimide (P-1011 brand from Epoxy Technology, Inc.). The resulting laminate was then oven dried for 25 minutes at about 67.2° C. and then cooled to room temperature.

The laminate made by the foregoing procedure was passed through a pressure nip with the selected support film such that the adhesive pattern faced the support film to laminate the adhesive pattern thereto. Sufficient pressure was used to effect such transfer and the composite was heated to about 67.2° C. for one minute.

The support film selected for use in this Example was 127 micron thick polypropylene (N-400 brand from Hercules) that contained no release coating on the side to which the adhesive pattern was laminated.

After the adhesive pattern had been transferred to the support films, the same type of paper originally used in the screen printing of the adhesive was used as a cover sheet for the exposed surface of the adhesive pattern. This cover sheet was fed with the adhesive/support film laminate through two pressure nips so that the release coating and exposed surface of the adhesive pattern were brought together under sufficient pressure to bond the release paper and laminate.

The type of laminate described above was then tested (after removal of the cover sheet) to determine if the adhesive separated readily from the support film. The following procedure was used. A silicon wafer was affixed to the adhesive by action of a squeegee to eliminate air entrapment. After attachment had been completed, an attempt was made by hand to remove the wafer and its attached adhesive cleanly from the support film.

One half dozen samples were prepared using the above procedure. When attempts were made to remove the wafer from the support film from each of the samples, it was found that only from about 50% to about 90% of the adhesive transferred cleanly from the support film to the wafer.

EXAMPLE 2

This Example illustrates the process of the present invention.

The procedure described in Comparative Example 1 was utilized with the exception that the bonded combination of wafer and adhesive/support film laminate was heated for one minute at about 67.2° C. prior to attempting to remove the wafer from the adhesive pattern. When the attempt to remove the wafer was made, substantially all of the adhesive cleanly released from the support film with the wafer.

The foregoing Examples serve to illustrate certain embodiments of the present invention and should not be construed in a limiting sense. The scope of protection which is sought is given in the claims which follow.

What is claimed is:

1. A process for forming individual chips from a semiconductor wafer by dicing said wafers into the individual chips which comprises:
   (a) attaching the wafer to a conductive adhesive which is bonded to a plastic support film which is substantially free of a release layer on the side to which the adhesive is bonded;
   (b) heating the resulting article to improve the release characteristics between the conductive adhesive and the support film prior to the dicing of the wafer; and
   (c) removing the chip with adhesive substantially bonded thereto and with substantially no adhesive remaining on the support film after the dicing step has been completed.

2. A process as claimed in claim 1 in which the support film is formed of a polyolefin polymer.

3. A process as claimed in claim 1 wherein the support film is polypropylene.

4. A process as claimed in claim 1 wherein the support film has a thickness of from about 25 microns to about 150 microns.

5. A process as claimed in claim 1 wherein the film is polyolefin of about 25-150 micron thickness.

6. A process as claimed in claim 1 wherein the film is polypropylene of about 25-150 micron thickness.

7. A process as claimed in claim 1 wherein the conductive adhesive has a thickness of from about 6 to about 40 microns.

8. A process as claimed in claim 1 wherein the conductive adhesive contains an effective amount for conductivity of a conductive metal in an adhesive matrix.

9. A process as claimed in claim 2 wherein the support film has a thickness of about 25–150 microns and the adhesive has a thickness of about 6–40 microns.

10. A process as claimed in claim 3 having a conductive adhesive of a thickness of from about 6 microns to about 40 microns and wherein the adhesive contains an effective amount for conductivity of a conductive metal in an adhesive matrix.

11. A process as claimed in claim 1 wherein the heating in step (b) is from about 45° C. to about 70° C. for about 0.25 minutes to about 3 minutes.

12. A process as claimed in claim 2 wherein the heating in step (b) is from about 45° C. to about 70° C. for about 0.25 minutes to about 3 minutes.

13. A process as claimed in claim 3 wherein the heating in step (b) is from about 45° C. to about 70° C. for about 0.25 minutes to about 3 minutes.

* * * * *